(12) United States Patent
Shajaan et al.

(10) Patent No.: US 10,880,646 B2
(45) Date of Patent: *Dec. 29, 2020

(54) MICROPHONE ASSEMBLY WITH DIGITAL FEEDBACK LOOP

(71) Applicant: Knowles Electronics, LLC, Itasca, IL (US)

(72) Inventors: Mohammad Shajaan, Værløse (DK); Claus Erdmann Fürst, Roskilde (DK); Per Flemming Høvesten, Måløv (DK); Kim Spetzler Berthelsen, Køge (DK); Henrik Thomsen, Holte (DK)

(73) Assignee: Knowles Electronics, LLC, Itasca, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/685,359

(22) Filed: Nov. 15, 2019

(65) Prior Publication Data

US 2020/0186922 A1 Jun. 11, 2020

Related U.S. Application Data

(63) Continuation of application No. 15/202,404, filed on Jul. 5, 2016, now Pat. No. 10,499,150.

(51) Int. Cl.
| | |
|---|---|
| *H04R 3/00* | (2006.01) |
| *H03M 1/00* | (2006.01) |
| *H03M 3/00* | (2006.01) |
| *H04R 3/02* | (2006.01) |
| *H04R 3/04* | (2006.01) |
| *H03F 3/70* | (2006.01) |
| *H03F 3/34* | (2006.01) |

(Continued)

(52) U.S. Cl.
CPC ............... *H04R 3/02* (2013.01); *H04R 3/04* (2013.01); *H03F 3/34* (2013.01); *H03F 3/70* (2013.01); *H03G 3/30* (2013.01); *H03M 1/181* (2013.01); *H03M 3/464* (2013.01); *H03M 3/48* (2013.01); *H03M 3/49* (2013.01); *H04R 1/04* (2013.01)

(58) Field of Classification Search
CPC ........ H04M 1/00; H03M 3/464; H03M 3/344; H03M 1/181; H04R 3/02; H04R 3/04
USPC ...................... 381/113, 111, 95, 93
See application file for complete search history.

(56) References Cited

U.S. PATENT DOCUMENTS

| | | |
|---|---|---|
| 4,390,849 A | 6/1983 | Miskin |
| 5,822,598 A | 10/1998 | Lam |

(Continued)

*Primary Examiner* — Vivian C Chin
*Assistant Examiner* — Ubachukwu A Odunukwe
(74) *Attorney, Agent, or Firm* — Foley & Lardner LLP

(57) ABSTRACT

A microphone assembly includes a transducer element and a processing circuit. The processing circuit includes an analog-to-digital converter (ADC) configured to receive, sample and quantize a microphone signal generated by the transducer element to generate a corresponding digital microphone signal. The processing circuit includes a feedback path including a digital loop filter configured to receive and filter the digital microphone signal to provide a first digital feedback signal and a digital-to-analog converter (DAC) configured to convert the first digital feedback signal into a corresponding analog feedback signal. The processing circuit additionally includes a summing node at the transducer output configured to combine the microphone signal and the analog feedback signal.

20 Claims, 10 Drawing Sheets

(51) Int. Cl.
  *H03G 3/30* (2006.01)
  *H03M 1/18* (2006.01)
  *H04R 1/04* (2006.01)

(56) References Cited

U.S. PATENT DOCUMENTS

| | | | |
|---|---|---|---|
| 6,070,140 | A | 5/2000 | Tran |
| 6,154,721 | A | 11/2000 | Sonnic |
| 6,249,757 | B1 | 6/2001 | Cason |
| 6,397,186 | B1 | 5/2002 | Bush et al. |
| 6,756,700 | B2 | 6/2004 | Zeng |
| 7,190,038 | B2 | 3/2007 | Dehe et al. |
| 7,415,416 | B2 | 8/2008 | Rees |
| 7,473,572 | B2 | 1/2009 | Dehe et al. |
| 7,774,204 | B2 | 8/2010 | Mozer et al. |
| 7,781,249 | B2 | 8/2010 | Laming et al. |
| 7,795,695 | B2 | 9/2010 | Weigold et al. |
| 7,825,484 | B2 | 11/2010 | Martin et al. |
| 7,829,961 | B2 | 11/2010 | Hsiao |
| 7,852,247 | B2 | 12/2010 | Muhammad et al. |
| 7,856,804 | B2 | 12/2010 | Laming et al. |
| 7,903,831 | B2 | 3/2011 | Song |
| 7,957,972 | B2 | 6/2011 | Huang et al. |
| 8,275,148 | B2 | 9/2012 | Li et al. |
| 8,666,751 | B2 | 3/2014 | Murthi et al. |
| 8,972,252 | B2 | 3/2015 | Hung et al. |
| 8,996,381 | B2 | 3/2015 | Mozer et al. |
| 9,043,211 | B2 | 5/2015 | Haiut et al. |
| 9,112,984 | B2 | 8/2015 | Sejnoha et al. |
| 2002/0067838 | A1 | 6/2002 | Kindred et al. |
| 2002/0114386 | A1 | 8/2002 | Eklof |
| 2005/0207605 | A1 | 9/2005 | Dehe et al. |
| 2006/0074658 | A1 | 4/2006 | Chadha |
| 2007/0278501 | A1 | 12/2007 | Macpherson et al. |
| 2008/0129569 | A1* | 6/2008 | Muhammad .......... H03M 3/344 341/155 |
| 2008/0164890 | A1 | 7/2008 | Admon et al. |
| 2008/0175425 | A1 | 7/2008 | Roberts et al. |
| 2008/0267431 | A1 | 10/2008 | Leidl et al. |
| 2008/0272946 | A1 | 11/2008 | Melanson |
| 2008/0279407 | A1 | 11/2008 | Pahl |
| 2008/0283942 | A1 | 11/2008 | Huang et al. |
| 2009/0001553 | A1 | 1/2009 | Pahl et al. |
| 2009/0135033 | A1 | 5/2009 | Huppertz |
| 2009/0180655 | A1 | 7/2009 | Tien et al. |
| 2010/0046780 | A1 | 2/2010 | Song |
| 2010/0052082 | A1 | 3/2010 | Lee et al. |
| 2010/0128914 | A1 | 5/2010 | Khenkin |
| 2010/0183181 | A1 | 7/2010 | Wang |
| 2010/0246877 | A1 | 9/2010 | Wang et al. |
| 2010/0290644 | A1 | 11/2010 | Wu et al. |
| 2010/0315272 | A1 | 12/2010 | Steele et al. |
| 2010/0322443 | A1 | 12/2010 | Wu et al. |
| 2010/0322451 | A1 | 12/2010 | Wu et al. |
| 2011/0013787 | A1 | 1/2011 | Chang |
| 2011/0051954 | A1 | 3/2011 | Thomsen et al. |
| 2011/0075875 | A1 | 3/2011 | Wu et al. |
| 2011/0142261 | A1 | 6/2011 | Josefsson |
| 2012/0038500 | A1 | 2/2012 | Dijkmans et al. |
| 2012/0043974 | A1 | 2/2012 | Van Den Boom et al. |
| 2012/0232896 | A1 | 9/2012 | Taleb et al. |
| 2012/0310641 | A1 | 12/2012 | Niemisto et al. |
| 2013/0223635 | A1 | 8/2013 | Singer et al. |
| 2014/0163978 | A1 | 6/2014 | Basye et al. |
| 2014/0244269 | A1 | 8/2014 | Tokutake |
| 2014/0257821 | A1 | 9/2014 | Adams et al. |
| 2014/0270261 | A1 | 9/2014 | Wiesbauer et al. |
| 2014/0274203 | A1 | 9/2014 | Ganong et al. |
| 2014/0278435 | A1 | 9/2014 | Ganong et al. |
| 2014/0281628 | A1 | 9/2014 | Nigam et al. |
| 2014/0343949 | A1 | 11/2014 | Huang et al. |
| 2015/0023529 | A1 | 1/2015 | Barzen et al. |
| 2015/0106085 | A1 | 4/2015 | Lindahl |
| 2015/0112690 | A1 | 4/2015 | Guha et al. |
| 2015/0134331 | A1 | 5/2015 | Millet et al. |
| 2015/0304786 | A1* | 10/2015 | Partio .................. H04R 25/305 381/58 |
| 2016/0112795 | A1* | 4/2016 | Bach .................... H03M 3/464 381/93 |
| 2016/0127845 | A1 | 5/2016 | Cagdaser et al. |
| 2016/0146852 | A1* | 5/2016 | Romano ............. G01C 25/005 73/488 |
| 2017/0154715 | A1 | 6/2017 | Li |

* cited by examiner

MICROPHONE ASSEMBLY WITH DIGITAL FEEDBACK LOOP

CROSS-REFERENCE TO RELATED PATENT APPLICATIONS

The present application is a continuation of U.S. patent application Ser. No. 15/202,404, filed on Jul. 5, 2016, the entire contents of which are incorporated herein by reference.

BACKGROUND

Portable communication and computing devices such as smartphones, mobile phones, tablets etc. are compact devices which are powered from rechargeable battery sources. The compact dimensions and battery source put severe constraints on the maximum acceptable dimensions and power consumption of microphones and microphone amplification circuit utilized in such portable communication devices.

US 2011/0051954 A1 discloses a signal conditioner for a capacitive transducer. The signal conditioner includes a differential preamplifier which includes a non-inverting input connected to a microphone transducer output and a separate inverting input connected to the output of a feedback path. The feedback path includes a digital-to-analogue converter and extends from an output of an analogue-to-digital converter to the inverting input of the preamplifier.

However, there exists a continued need to improve the sound quality and robustness of microphone assemblies for example by accurately controlling the frequency response and reducing or eliminating overload distortion of signal processing circuits like microphone preamplifiers at high sound pressure levels. The overload and distortion problems are often caused by saturation and non-linearity of active amplification elements like transistors of the signal processing circuits.

SUMMARY

A first aspect relates to a microphone assembly including a transducer configured to convert sound into a microphone signal at a transducer output and a processing circuit. The processing circuit includes a preamplifier including an input node connected to the transducer output for receipt of the microphone signal, the preamplifier being configured to generate at least one of an amplified microphone signal and a buffered microphone signal, and an analog-to-digital converter (ADC) configured to receive, sample and quantize the amplified or buffered microphone signal to generate a corresponding digital microphone signal. The processing circuit additionally includes a feedback path including a digital loop filter which includes an adjustable or fixed transfer function, the digital loop filter being configured to receive and filter the digital microphone signal to provide a first digital feedback signal and a digital-to-analog converter (DAC) configured to convert the first digital feedback signal into a corresponding analog feedback signal. The processing circuit additionally includes a summing node at the transducer output configured to combine the microphone signal and the analog feedback signal.

A second aspect relates to a method of controlling a frequency response of a signal amplification path of a microphone. The method includes a) converting incoming sound into a corresponding microphone signal at a microphone transducer output; b) sampling and quantizing the microphone signal by an analog-to-digital converter (ADC) to generate a corresponding digital microphone signal; c) lowpass filtering the digital microphone signal to provide a first digital feedback signal; d) converting the first digital feedback signal into a corresponding analog feedback signal by digital-to-analog converter (DAC); and e) combining the microphone signal and the analog feedback signal at the microphone transducer output to close a digital feedback loop.

The foregoing summary is illustrative only and is not intended to be in any way limiting. In addition to the illustrative aspects, embodiments, and features described above, further aspects, embodiments, and features will become apparent by reference to the following drawings and the detailed description.

BRIEF DESCRIPTION OF THE DRAWINGS

The foregoing and other features of the present disclosure will become more fully apparent from the following description and appended claims, taken in conjunction with the accompanying drawings. These drawings depict only several embodiments in accordance with the disclosure and are, therefore, not to be considered limiting of its scope. Various embodiments are described in more detail below in connection with the appended drawings.

Figure 1:
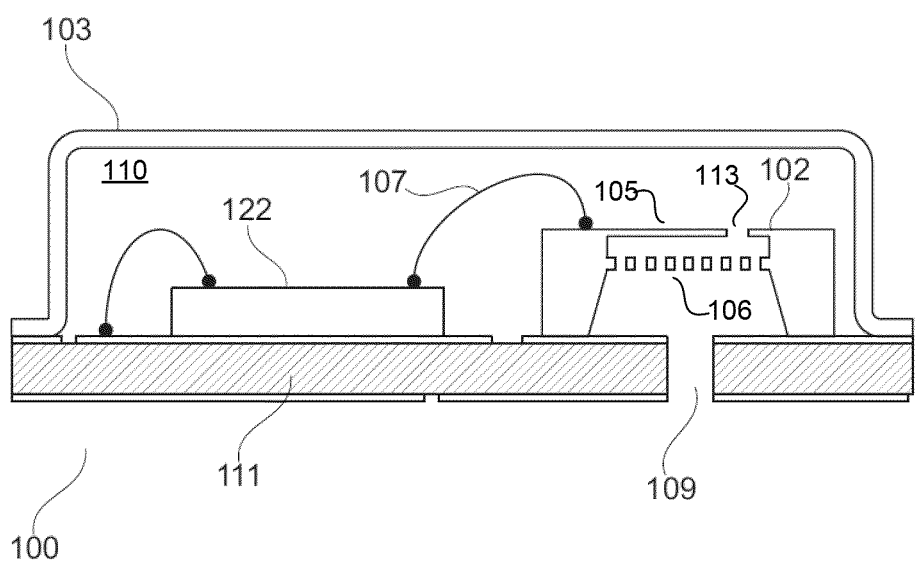
FIG. 1 is a schematic illustration of an exemplary miniature microphone assembly according to various embodiments.

In the following detailed description, various embodiments are described with reference to the appended drawings. The skilled person will understand that the accompanying drawings are schematic and simplified for clarity and therefore merely show details which are essential to the understanding of the present disclosure, while other details have been left out. Like reference numerals refer to like elements or components throughout. Like elements or components will therefore not necessarily be described in detail with respect to each figure. It will further be appreciated that certain actions and/or steps may be described or depicted in a particular order of occurrence while those skilled in the art will understand that such specificity with respect to sequence is not actually required.

DETAILED DESCRIPTION

One aspect of the present disclosure relates to a microphone assembly including a transducer and a processing circuit. The processing circuit includes an analog-to-digital converter (ADC) configured to receive, sample and quantize a microphone signal generated by the transducer to generate a corresponding digital microphone signal. The processing circuit includes a feedback path including a digital loop filter configured to receiving and filtering the digital microphone signal to provide a first digital feedback signal and a digital-to-analog converter (DAC) configured for converting the first digital feedback signal into a corresponding analog feedback signal. The processing circuit additionally includes a summing node at the transducer output configured to combining the microphone signal and the analog feedback signal.

Another aspect relates to a microphone assembly including a transducer configured to convert sound into a microphone signal at a transducer output and a processing circuit. The processing circuit includes a preamplifier including an input node connected to the transducer output for receipt of the microphone signal, the preamplifier being configured to generate at least one of an amplified microphone signal and a buffered microphone signal, and an analog-to-digital converter (ADC) configured to receive, sample and quantize the amplified or buffered microphone signal to generate a corresponding digital microphone signal. The processing circuit additionally includes a feedback path including a digital loop filter which includes an adjustable or fixed transfer function, the digital loop filter being configured to receive and filter the digital microphone signal to provide a first digital feedback signal and a digital-to-analog converter (DAC) configured to convert the first digital feedback signal into a corresponding analog feedback signal. The processing circuit additionally includes a summing node at the transducer output configured to combine the microphone signal and the analog feedback signal.

The transducer may include a capacitive transducer (e.g., a microelectromechanical system (MEMS) transducer) configured to convert incoming sound into a corresponding microphone signal. The capacitive transducer may for example exhibit a transducer capacitance between 0.5 pF and 10 pF. Some embodiments of the capacitive transducer may include first and second mutually charged transducer plates, e.g. a diaphragm and back plate, respectively, supplying the microphone signal. The charge may be injected onto one of the diaphragm and back plate by an appropriate high-impedance DC bias voltage supply. The processing circuit may include a semiconductor die, for example a mixed-signal CMOS semiconductor device integrating the preamplifier, analog-to-digital converter, digital loop filter, digital-to-analog converter and optionally various other analog and digital circuits as discussed below.

The microphone assembly may be shaped and sized to fit into portable audio and communication devices such as smartphones, tablets and mobile phones, etc. The transducer may be responsive to audible sound.

The analog-to-digital converter may be adapted to producing a multibit or single-bit digital microphone signal representative of the microphone signal depending on the particular converter type. Some embodiments of the analog-to-digital converter may include an oversampled converter type such as a single-bit or multibit sigma-delta converter (IA) configured to generate a single-bit (PDM) or multibit digital microphone signal at a first sampling frequency. The multibit sigma-delta converter (IA) may be configured to generate the multibit digital microphone signal with samples of two, three or four bits. The first sampling frequency may lie between 1 MHz and 20 MHz, such as between 2.048 MHz and 4.196 MHZ, for example 3.092 MHz. The feedback path may include a decimator arranged in-front of an input of the digital loop filter. The decimator is configured to convert the single-bit (PDM) or multibit digital microphone signal into a decimated multibit (PCM) microphone signal at a second sampling frequency. The second sampling frequency is lower than the previously discussed first sampling frequency. The second sampling frequency may be between 8 and 64 times lower than the first sampling frequency, e.g., accomplished by configuring the decimator with decimation factors between 8 and 64, such as 16 or 32. The samples of the decimated multibit (PCM) microphone signal may possess a higher number of bits, e.g., between 12 and 32 bits, or for example, 24 bits, than the samples of the single-bit or multibit digital microphone signal to retain high signal resolution through the feedback path despite the reduced sampling frequency. The skilled person will understand that the preamplifier or buffer may be integrated within the analog-to-digital converter in some embodiments.

The digital-to-analog converter is configured to convert the first digital feedback signal into a corresponding analog feedback signal which is combined with the microphone signal at the transducer output such that a feedback loop is closed in-front of and around the microphone preamplifier. In some embodiments, the analog feedback signal and microphone signal may be summed by electrically connecting the transducer output and an output of the digital-to-analog converter. The application of the analog feedback signal to the transducer output of the transducer leads to numerous advantages compared with prior art approaches. The coupling scheme effectively prevents low-frequency overload of the preamplifier or buffer which must receive and process the full dynamic range of the microphone signal generated by the transducer without unacceptable distortion. This is accomplished by an anti-phase low-frequency component supplied by the analog feedback signal which cancels or suppresses low-frequency components of the microphone signal at the input node, or nodes, of the preamplifier or buffer. Hence, attenuating or suppressing high level low-frequency components of the microphone signal at the input of the preamplifier or buffer. The high level low-frequency components of the microphone signal are caused by the exposure to intense subsonic or low-frequency sounds generated by wind noise, large machinery, etc. This suppression of high level low-frequency components of the microphone signal at the input of the preamplifier or buffer markedly reduces the maximum signal level of the microphone signal which the preamplifier or buffer must be able to handle in an undistorted manner. Hence, eliminating the vulnerability of the preamplifier or buffer to low-frequency induced overload and distortion.

The preamplifier may be a DC-coupled design or an AC-coupled design. The DC-coupled preamplifier or buffer possesses several advantageous properties over the AC-coupled design due to the elimination of resistors and capacitor of a traditional analog highpass filter used to set a highpass cut-off frequency of a forward microphone amplification path. The forward microphone amplification path may be extending from the transducer output to at least the analog-to-digital converter output. The elimination of the resistors and capacitors of the analog highpass filter at the preamplifier or buffer leads to a smaller semiconductor die area, reduced thermal noise and much improved flexibility in the choice of the highpass cut-off frequency of the forward microphone amplification path. Instead, the highpass cut-off frequency of the forward microphone amplification path may be controlled or dominated by a lowpass cut-off frequency of the digital loop filter as discussed below. The frequency response of the digital loop filter, including its lowpass cut-off frequency, is inherently significantly more accurate than the frequency response of the traditional analog highpass filter, because resistors and capacitors of the analog highpass filter exhibit substantial manufacturing spread and drift over time and temperature making accurate frequency response control difficult, expensive or both.

The accurate frequency response setting of the forward microphone amplification path afforded by the properties of the digital loop filter also improves frequency response matching, inclusive phase matching, between individual microphone assemblies of a beamforming microphone array. This improved response matching leads to improved, predictable and stable directional response of the beamforming microphone array.

The digital-to-analog converter may exhibit a very large output impedance to supply the current of the analog feedback signal into a load including a high-impedance capacitive transducer without causing undesirable attenuation and/or distortion of the microphone signal at the transducer output. In certain embodiments, the output impedance of the digital-to-analog converter 10 kHz may be larger than 1 MΩ, such as larger than 10 MΩ, or 100 MΩ.

The skilled person will understand that the analog feedback signal may be directly connected to the transducer output, e.g., at least one transducer plate of a capacitive transducer element. In that context, directly means through an electrically conductive path without any intervening active devices like transistors, but possibly through passive components like resistors, capacitors, electrical traces, wires, etc. This feature effectively prevents the above-mentioned overload and distortion problems of the preamplifier and buffer at high levels of the microphone signal caused by saturation and non-linearity of active amplification elements like transistors of the preamplifier or buffer circuitry. This low-frequency cut-off frequency may in practice be accurately controlled by a setting of the lowpass cut-off frequency of the digital loop filter as discussed above. The digital signal processing of the digital loop filter allows a very accurate and stable setting of the frequency response of the forward microphone amplification path, in particular in combination with the DC-coupled preamplifier or buffer as discussed above.

The digital loop filter may include a lowpass filter possessing a cut-off frequency placed at or above 10 Hz, for example at or above 50 Hz, 100 Hz or 1000 Hz. The lowpass filter may include a first, second or third order response characteristic. The skilled person will understand that the lowpass cut-off frequency of the digital loop filter may be selected such that a desired highpass cut-off frequency of the forward microphone amplification path is obtained. The latter highpass cut-off frequency may be situated between 10 Hz and 4000 Hz, such as between 100 Hz and 1 kHz, for various embodiments of the microphone assembly depending on requirements of a specific application. The digital loop filter may include an adjustable or programmable transfer function in certain embodiments of the processing circuit. The transfer function may be controlled by filter configuration data which may determine the previously discussed cut-off frequency of the lowpass filter. The filter configuration data may include respective values of one or more filter coefficients of the digital loop filter. The filter configuration data may be received by the processing circuit via an integrated command and control interface. The integrated command and control interface allows the microphone assembly to connect to a compatible data interface of the host processor and thereby receive the filter configuration data from the host processor. The programmable transfer function of the digital loop filter allows the microphone assembly to be tailored to requirements of a particular application in connection with, or after, manufacturing in a flexible manner and therefore serves to reduce the number of variants needed of the microphone assembly.

The processing circuit may include a digital processor implementing the functionality of the digital loop filter and/or other control functions of the processing circuit such as state switching of the digital-to-analog converter, controlling the operation of a command and control interface connectable to host processor of a portable communication device, e.g. a smartphone, etc. The digital processor may comprise a digital state machine and/or a software programmable microprocessor such as a digital signal processor (DSP).

According to some embodiments, the digital-to-analog converter (DAC) includes a hybrid Pulse-Width and Pulse-Amplitude Modulator (PWAM) configured to generate the analog feedback signal by converting the first digital feedback signal into a corresponding pulse-width and pulse-amplitude modulated signal at a higher sampling frequency than a sampling frequency of the first digital feedback signal. The pulse-width and pulse-amplitude modulated signal may include a sequence of variable width and amplitude current pulses generated by a current output converter representative of the samples of the first digital feedback signal. Hence, one embodiment of the hybrid Pulse-Width and Pulse-Amplitude Modulator includes a current output converter configured for converting the pulse-width and pulse-amplitude modulated signal into a corresponding sequence of variable width and amplitude current pulses. The current output converter includes a plurality of individually controllable current generators connected in parallel to the DAC output. The current output converter may include between 8 and 32 individually controllable current generators connected in parallel to the DAC output. The skilled person will understand that the capacitance of the capacitive transducer at the transducer output effectively lowpass filters or smoothes the variable width and amplitude current pulses that may be supplied by the output of the hybrid Pulse-Width and Pulse-Amplitude Modulator to suppress or eliminate undesired high frequency components in the analog feedback signal. In the above-mentioned current output converter each of the plurality of individually controllable current generators may include a first current source connected between a positive DC supply rail of the current output converter and the DAC output for sourcing a first current level to the DAC output; and a second current source connected between the DAC output and a negative DC supply rail of the current output converter for sinking a second current level from the DAC output. The individually controllable current generator may furthermore include a DC error suppression circuit configured for matching the first and second current levels. The matching or equalization of the first and second current levels by the operation of the DC error suppression circuit has several noticeable advantages, for example, leading to a linear I/O characteristic of the current output converter. The DC error suppression circuit also prevents the build-up of DC voltage components on the load which is a noticeable advantage in connection with driving capacitive transducer elements where DC offsets or DC imbalances of the output signal at the DAC output will tend to drive a DC operating point of the capacitive transducer away from a target DC operating point as discussed in further detail below with reference to the appended drawings.

Some embodiments of the hybrid Pulse-Width-Modulator and Pulse-Amplitude-Modulator may include a noise-shaping quantizer configured to receive samples, having a first bit-width, of the first digital feedback signal outputted by the digital loop filter; and quantize the samples of the first digital feedback signal to generate samples of a second digital feedback signal with a reduced bit-width. The noise-shaping quantizer may quantize samples of an incoming digital signal to fewer bits, e.g., samples with reduced bit-width. The noise-shaping quantizer may for example quantize samples of the first digital feedback signal from e.g., 32 bits or 24 bits down to less than 16 bits, or less than 12 bits, such as 11 bits. The noise-shaping quantizer is configured to shape a spectrum of the quantization noise generated by the quantization process to reduce its audibility. Hence, the quantization noise may be pushed upwards in frequency above the audible range, for example above 20 kHz. The first digital feedback signal may have a sampling frequency at or above 48 kHz, for example above 96 kHz, such as 192 kHz or 384 kHz. The second digital feedback signal may subsequently be converted into the pulse-width and pulse-amplitude modulated signal as discussed in further detail below with reference to the appended drawings.

The hybrid Pulse-Width and Pulse-Amplitude Modulator is capable of generating the analog feedback signal with a high resolution at a relatively low conversion frequency as discussed in further detail below with reference to the appended drawings. The skilled person will understand that alternative embodiments of the hybrid Pulse-Width and Pulse-Amplitude Modulator may lack the current output converter and instead exhibit a relatively small output impedance supplying the pulse-width and pulse-amplitude modulated signal as a sequence of variable width and amplitude voltage pulses. The hybrid Pulse-Width and Pulse-Amplitude Modulator disclosed herein may be exploited for conversion of digital signals into corresponding analog signals in a variety of other applications than the microphone assembly described herein.

The skilled person will also understand that the current output converter described herein can be utilized for DC error-free conversion of a digital signal to an analog signal in numerous other applications than the hybrid Pulse-Width and Pulse-Amplitude Modulator described herein.

Further aspects of the present disclosure relate to a method of controlling a frequency response of a signal amplification path of a microphone. The method includes a) converting incoming sound into a corresponding microphone signal at a microphone transducer output; b) sampling and quantizing the microphone signal by an analog-to-digital converter (ADC) to generate a corresponding digital microphone signal; c) lowpass filtering the digital microphone signal to provide a first digital feedback signal; d) converting the first digital feedback signal into a corresponding analog feedback signal by digital-to-analog converter (DAC); and e) combining the microphone signal and the analog feedback signal at the microphone transducer output to close a digital feedback loop.

The methodology may further include f) applying the analog feedback signal to a capacitive transducer for example applying the analog feedback signal to at least one transducer plate of a capacitive microelectromechanical (MEMS) transducer supplying the microphone signal. The application of the analog feedback signal of the capacitive transducer allows accurate control of the frequency response of the forward microphone amplification path for the reasons discussed in considerable detail above.

The method of controlling the frequency response of the signal amplification path may further include g) quantizing and noise shaping the first digital feedback signal to generate a second digital feedback signal with a smaller bit-width than a bit-width of the first digital feedback signal.

The bit-width of the first digital feedback signal may be larger than 20 bits, such as 24 bits, while the bit-width of the second digital feedback signal may be less than 16 bits, such as 11 bits, e.g., 10 bits magnitude representation and one sign bit, as discussed in further detail below with reference to the appended drawings.

The method of controlling the frequency response of the signal amplification path may further include increasing a sampling frequency of the second digital feedback signal with a predetermined upsampling factor, N, to generate a third digital feedback signal; and converting the third digital feedback signal into a pulse-width and pulse-amplitude modulated signal.

The skilled person will understand that the above conversion of the third digital feedback signal may include h) dividing a first sample of the third digital feedback signal with the predetermined upsampling factor, N, to compute a modulus value and remainder value of the first sample; i) converting the modulus value of the first sample into a first pulse segment having a combined pulse width and pulse amplitude representative of the modulus value; j) converting each remainder value of the first sample into a second pulse segment with a pulse width representing the remainder value; k) combining the first and second pulse segments of the first sample to form a first variable width and amplitude pulse; and l) repeating steps h)-k) for subsequent samples of the third digital feedback signal to generate the pulse-width and pulse-amplitude modulated signal by a sequence of variable width and amplitude pulses. Hence, the sequence of variable width and amplitude pulses are representative of the samples of the third digital feedback signal as discussed in further detail below with reference to the appended drawings.

Further aspects of the present disclosure relate to a semiconductor die including a processing circuit according to any of the above-described embodiments thereof. The processing circuit may include a CMOS semiconductor die. The processing circuit may be shaped and sized for integration into a miniature microphone housing or package. The microphone assembly may therefore include a microphone housing enclosing and supporting the transducer and the processing circuit. A bottom portion of the microphone housing may include a carrier board, such as a printed circuit board, onto which the processing circuit and the transducer are attached or fixed by a suitable bonding mechanism. The microphone housing may include a sound port or inlet allowing sound passage to the transducer as discussed in further detail below with reference to the appended drawings.

Further aspects of the present disclosure relate to a portable communication device including a microphone assembly according to any of the above-described embodiments thereof. The portable communication device may include an application processor, e.g., a microprocessor such as a Digital Signal Processor. The application processor may include a data communication interface compliant with, and connected to, an externally accessible data communication interface of the microphone assembly. The data communication interface may include a proprietary interface or a standardized data interface, such as one of I²C, USB, UART, SoundWire or SPI compliant data communication interfaces. Various types of configuration data of the processing circuit, for example for programming or adapting characteristics of the digital loop filter, may be transmitted from the application processor to the microphone assembly, as discussed in further detail below with reference to the appended drawings.

In some embodiments, the present microphone assembly may form part of a portable communication device such as a smartphone where one, two, three or more microphone assemblies may be integrated for picking-up and processing various types of acoustic signals such as speech and music. Some exemplary embodiments of the present approaches, microphone assemblies and methodologies may be tuned or adapted to different types of applications through configurable parameters as discussed in further detail below. These parameters may be loaded into suitable memory cells of the microphone assembly on request via the configuration data discussed above, for example, using the previously mentioned command and control interface. The latter may include a standardized data communication interface such as SoundWire, I2C, UART and SPI.

FIG. 1 shows an exemplary embodiment of a microphone assembly or system 100. The microphone assembly 100 includes a capacitive transducer 102, e.g. a microelectromechanical system (MEMS) transducer, configured to convert incoming sound into a corresponding microphone signal. The capacitive transducer includes a diaphragm 105 movable relative to a back plate 106 in response to changes in air pressure entering the housing via the sound port 109. The diaphragm 105 includes a pressure equalization opening or pierce 113 that inherently functions as an acoustic high pass filter with a cutoff frequency that is a function of the diameter of the opening. The transducer 102 may, for example, exhibit a transducer capacitance between 0.5 pF and 10 pF. The capacitive transducer may include first and second mutually charged transducer plates, e.g. a diaphragm and back plate, respectively, supplying the microphone signal. The charge may be injected onto one of the diaphragm and back plates by an appropriate high-impedance DC bias voltage supply (not shown). The microphone assembly 100 additionally includes a processing circuit 122, which may include a semiconductor die, for example a mixed-signal CMOS semiconductor device integrating the various analog and digital circuits discussed below. The processing circuit 122 is shaped and sized for mounting on a substrate or carrier element 111 of the assembly 100, where the carrier element likewise supports the capacitive transducer 102. The microphone assembly 100 includes a housing lid 103 mounted onto a peripheral edge of the substrate or carrier element 111 such that the housing lid 103 and carrier element 111 jointly form a microphone housing 110 enclosing and protecting the transducer 102 and the processing circuit 122 of the assembly 100. The microphone housing 110 may include a sound inlet or sound port 109 projecting through the carrier element 111, or through the housing lid 103 in other embodiments, for conveying sound waves to the transducer 102.

The transducer 102 generates a microphone signal at a transducer output (item 101a of FIG. 2) in response to impinging sound. The transducer output may for example include a pad or terminal that is electrically coupled to the processing circuit 122 via one or more bonding wires 107 electrically interconnecting respective signal pads of the transducer 102 and processing circuit 122.

Figure 2:
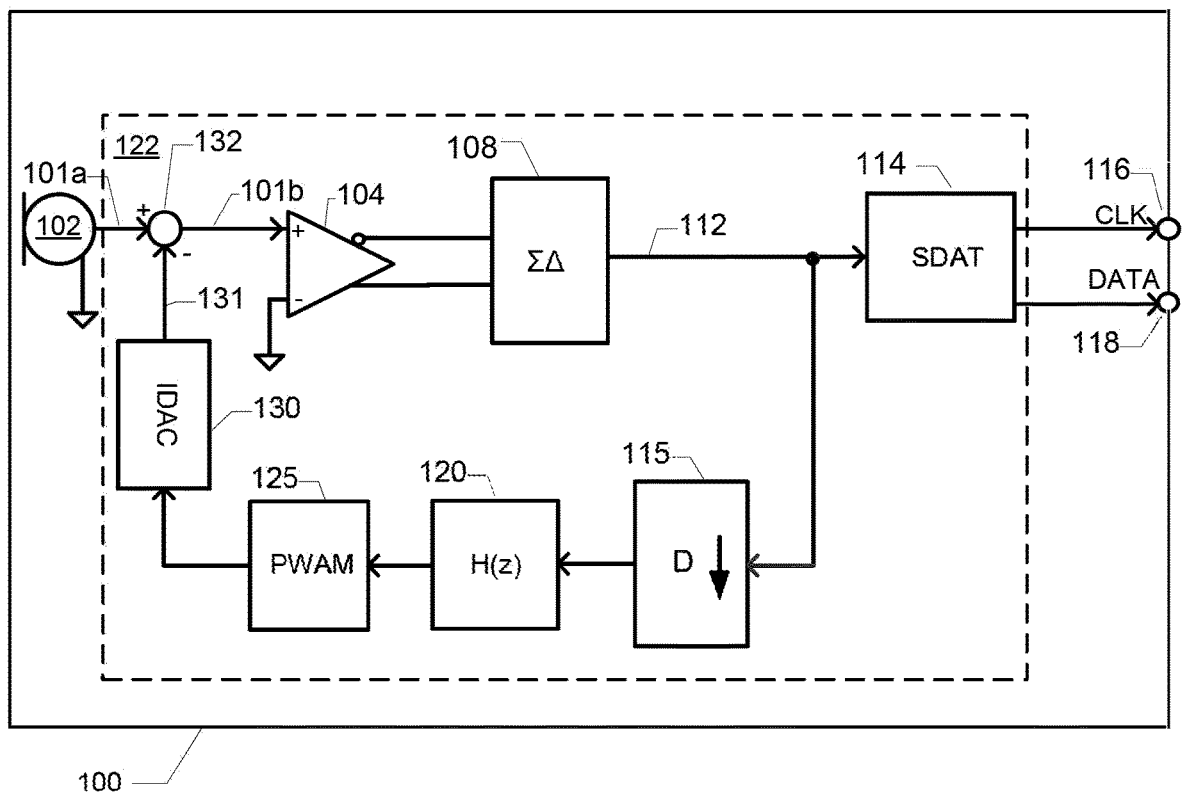
FIG. 2 is a simplified electrical block diagram of a processing circuit of a miniature microphone assembly according to various embodiments.

FIG. 2 shows a simplified electrical block diagram of an exemplary embodiment of the processing circuit 122 of the miniature microphone assembly 100. The processing circuit 122 includes a preamplifier or buffer 104 having an input node or terminal 101b connected to the transducer output 101a of the transducer 102 for receipt of the microphone signal produced by the transducer 102. The output of the preamplifier 104 supplies an amplified and/or buffered microphone signal to an analog-to-digital converter 108, which is configured for receipt, sampling and quantization of the amplified or buffered microphone signal to generate a corresponding digital microphone signal. The analog-to-digital converter 108 may be adapted to produce a multibit or single-bit digital microphone signal representative of the microphone signal depending on the particular converter type. Some embodiments of the analog-to-digital converter 108 includes a sigma-delta converter (ΙΑ) configured to generate a single-bit (PDM) digital microphone signal at a first sampling frequency. The first sampling frequency may lie between 2 MHz and 20 MHz such as 3.092 MHz. The skilled person will understand that the preamplifier 104 may be integrated with the analog-to-digital converter 108 in other embodiments.

The digital microphone signal is transmitted to an input of a command and control interface 114 configured to receive various types of data commands and filter configuration data for a programmable digital loop filter 120 from a host processor (now shown) of a portable communication device (e.g. a smartphone). The command/control interface 114 may include a separate clock line 116 (CLK) that clocks data on a data line 118 (DATA) of the interface 114. The command and control interface 114 may include a standardized data communication interface according to various serial data communication protocols, e.g., VC, USB, UART, SoundWire or SPI. The command and control interface 114 is configured to structure and encode the digital microphone signal in accordance with the relevant protocol of the interface 114 and transmits the digital microphone signal to the host processor. The microphone assembly 100 may be configured to receive and utilize various types of configuration data transmitted by the host processor. The configuration data may include data concerning a configuration of the processing circuit 122 such as filter coefficients of the digital loop filter 120.

The processing circuit 122 includes a feedback path extending at least from the digital microphone signal at the output 112 of the analog-to-digital converter 108 and back to the transducer output 101a, or microphone preamplifier input node 101b, since these nodes are electrically connected. The feedback path supplies an analog feedback signal to the summing node 132 at the transducer output 101a such that the path may be operative to set a highpass cut-off frequency of the frequency response of the forward microphone amplification path from the transducer output to the output 112 of the analog-to-digital converter 108. This highpass cut-off frequency may in practice be accurately controlled by a setting of a lowpass cut-off frequency of the digital loop filter 120 discussed above. The digital loop filter may via its digital processing nature exhibit a very accurate and stable frequency response setting in contrast to frequency response settings of conventional analog filters which rely on values of components like capacitors and resistors to determine the frequency response. Components like capacitors and resistors exhibit substantial manufacturing spread of component values and drift over time and temperature such that the frequency response setting of conventional analog filters are less accurate and stable than desired.

If the analog-to-digital converter 108 produces a digital microphone signal in the form of a single-bit (PDM) digital microphone signal or a multibit digital microphone signal with 2-4 bits, the digital feedback loop of the processing circuit 122 may include a decimator 115 arranged in-front of, e.g., at the input of, the digital loop filter 120. This decimator 115 is configured to convert the single-bit (PDM) or multibit digital microphone signal into a decimated multibit (PCM) feedback signal at a second sampling frequency. The second sampling frequency is lower than the first sampling frequency, which may lie between 2 MHz and 20 MHz, of the single-bit (PDM) digital microphone signal as discussed above. The second sampling frequency may be between 8 and 64 times lower than the first sampling frequency, e.g. accomplished by configuring the decimator 115 with decimation factors between 8 and 64, such as 16 or 32. The samples of the decimated multibit feedback signal may include between 16 and 32 bits to maintain a high signal resolution in the digital feedback path. This decimation and associated lowpass filtering of the single-bit (PDM) digital microphone signal may be helpful to suppress high-frequency noise components of the single-bit (PDM) digital microphone signal. The decimated multibit feedback signal is applied to an input of the digital loop filter 120 which filters the signal in accordance with an adjustable or fixed transfer function, such as the previously discussed lowpass frequency response, of the filter 120 to in response generate a first digital feedback signal at a filter output. Exemplary topologies and transfer functions of the digital loop filter 120 are discussed in detail below.

The first digital feedback signal supplied by the digital loop filter 120 is applied to a digital-to-analog converter (DAC) of the digital feedback loop. The DAC includes a hybrid Pulse-Width and Pulse-Amplitude Modulator (PWAM) 125 connected in series with a current output converter (IDAC) 130. The DAC is configured to convert the first digital feedback signal into a corresponding analog feedback signal, which is applied to the microphone preamplifier input node 101b. The latter node 101b is connected to the transducer output 101a as discussed herein, thereby closing the digital feedback loop. The skilled person will understand that the transducer output may be an extremely high impedance circuit node, e.g. an impedance corresponding to a capacitance of 0.5 pF to 10 pF, of a miniature capacitive transducer element. This property of the transducer output, and the design and electrical properties, in particular output impedance, of the current output converter 130 are discussed in further detail below with reference to the schematic diagram of the converter 130. The application of the analog feedback signal to the transducer output of the miniature capacitive transducer 102 leads to numerous advantages compared with prior art approaches. The direct coupling of the analog feedback signal to the transducer output effectively prevents low-frequency overload of the preamplifier or buffer 104 and/or the converter 108. This is accomplished by the lowpass filtering of the analog feedback signal carried out by the digital loop filter 120, which lowpass filtering cancels or suppresses low-frequency components of the microphone signal at the input node 101b, or input nodes, of the preamplifier or buffer 104. Furthermore, the noise floor of the microphone assembly 100 may be lowered by tailoring a frequency response of the miniature capacitive transducer 102 to the accurate frequency response of the forward microphone amplification path. Furthermore, the accurate control over the frequency response of the forward microphone amplification path improves frequency response matching, including phase matching, between individual microphone assemblies of a beamforming microphone array which may include 2, 3 or more microphone assemblies. This improved response matching leads to improved, predictable and stable directional response of the beamforming microphone array.

Figure 3:
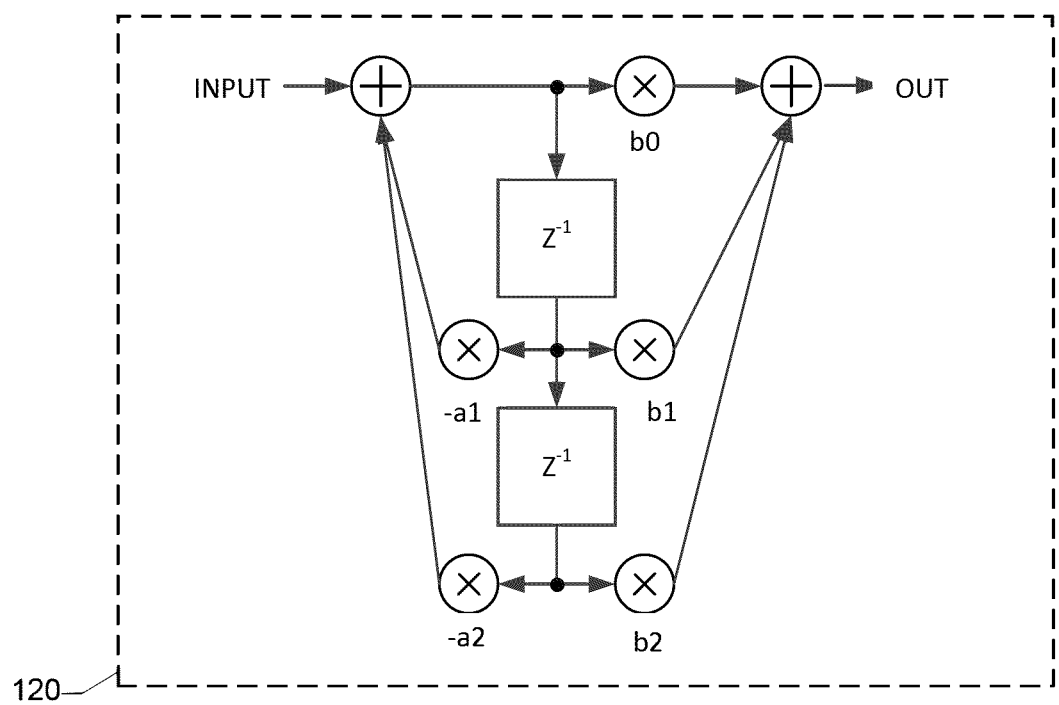
FIG. 3 is a block diagram of a digital loop filter of a feedback loop or path according to various embodiments.
Figure 3:
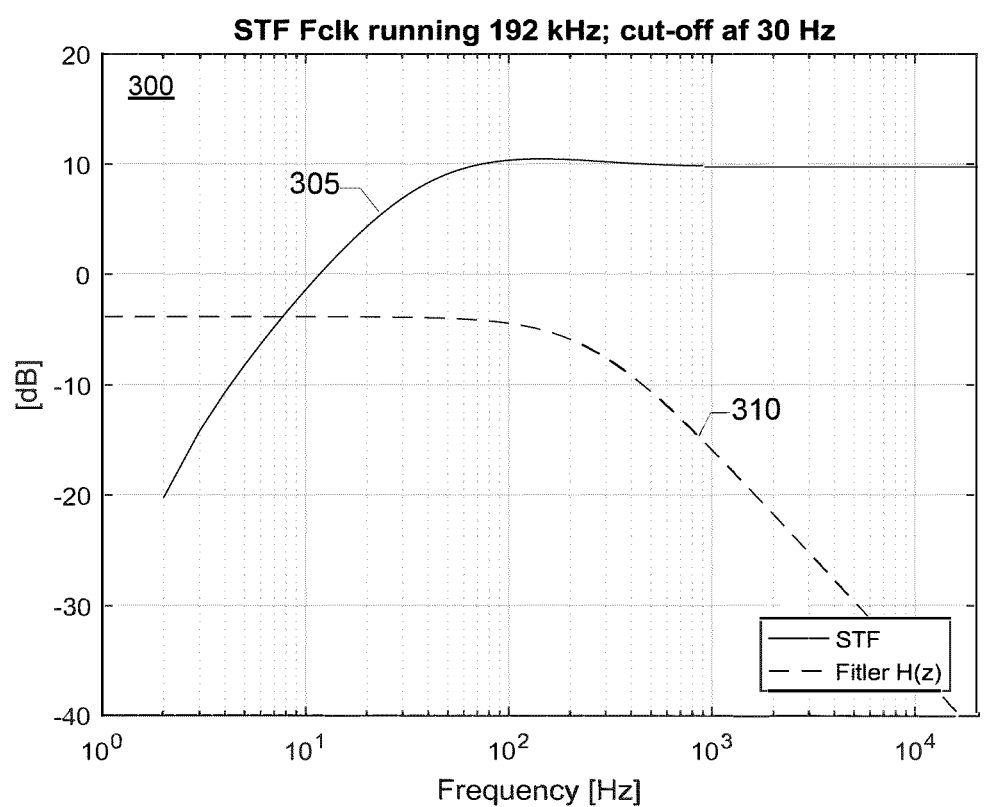

The upper portion of FIG. 3 shows a block diagram of an exemplary embodiment of the previously discussed digital loop filter 120 of the digital feedback loop or path of the processing circuit 122. The digital loop filter 120 has second order lowpass filter characteristics using a classical IIR filter bi-quad topology. The skilled person will understand that other digital filter types and topologies, such as FIR filters or other types of IIR filter topologies, may be utilized in alternative embodiments of the digital loop filter 120. Likewise, other filter orders may be used. The transfer function of the illustrated digital loop filter 120 is determined by values of the filter coefficients which include: a1, a2, b0, b1 and b2. The frequency response graph 300 of the lower portion of FIG. 3 shows an exemplary magnitude response 310 of the digital loop filter 120 where the lowpass cut-off frequency has been tuned to about 200 Hz. The corresponding magnitude response 305 of the forward microphone amplification path for this particular setting of the response 310 of the digital loop filter is also plotted. The skilled person will notice the expected $2^{nd}$ order highpass magnitude response of the forward microphone amplification path. The highpass cut-off frequency is set to approximately 30 Hz. The skilled person will understand that the lowpass cut-off frequency of the digital loop filter 120 may be adjusted over a broad frequency range to obtain a desired highpass cut-off frequency of the forward microphone amplification path. The latter highpass cut-off frequency may be situated in the frequency range between 10 Hz and 200 Hz for various embodiments of the microphone assembly depending on requirements of a specific application.

The skilled person will understand that certain embodiments of the processing circuit 122 may include an adjustable or programmable transfer function of the digital loop filter 120 where the transfer function is controlled by filter configuration data. The filter configuration data may include respective values of one or more of the previously discussed filter coefficients a1, a2, b0, b1 and b2. The filter configuration data may be received by the processing circuit 122 via the previously discussed command and control interface 114 from a host processor. The programmable transfer function of the digital loop filter 120 allows the microphone assembly to be tailored to requirements of a particular application after manufacturing in a flexible manner and therefore reduces the number of variants needed of the microphone assembly.

Other types of configuration data for various circuits and functions of the processing circuit 122 may likewise be programmed through the command and control interface 114. The configuration data, including filter configuration data, may be stored in rewriteable memory cells (not shown) of the processing circuit, such as flash memory, EEPROM, RAM, register files or flip-flops. These rewriteable memory cells may hold or store certain default values of the filter configuration data.

Figure 4:
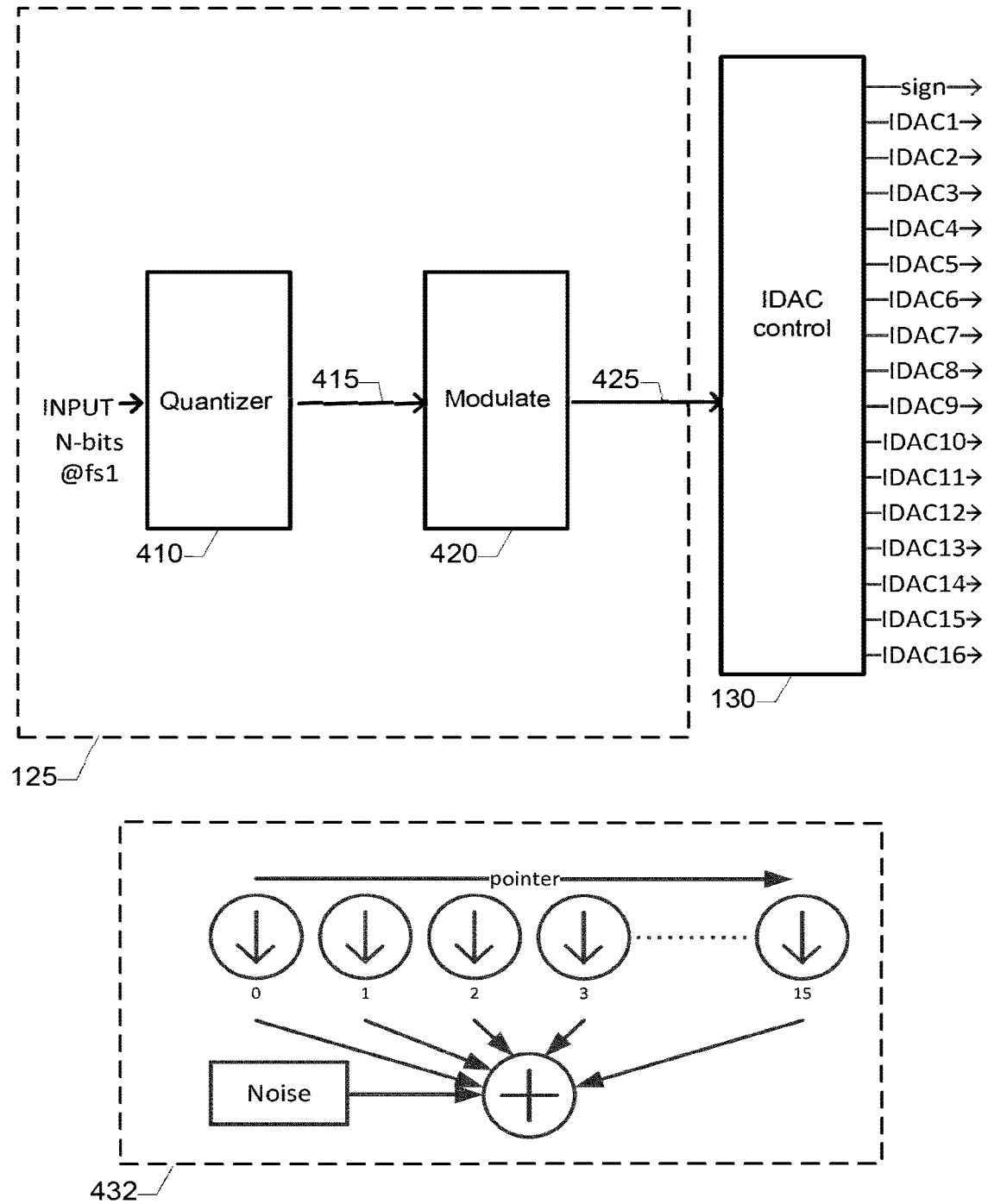
FIG. 4 is a simplified block diagram of a hybrid Pulse-Width and Pulse-Amplitude Modulator (PWAM) of a feedback loop or path of a processing circuit according to various embodiments.

FIG. 4 shows a simplified block diagram of an exemplary embodiment of the previously discussed hybrid Pulse-Width and Pulse-Amplitude Modulator (PWAM) 125 of the feedback path of the processing circuit. The output of the digital loop filter 120 is connected to the input of the PWAM 125 such that the previously discussed first digital feedback signal is applied to the input of the PWAM 125. The first digital feedback signal may be a multibit signal with a relatively high resolution—for example between 16 and 32 bits per sample, such as 24 bits per sample, to maintain a high signal resolution through the feedback path. The sampling frequency of the first digital feedback signal may lie between 32 kHz and 384 kHz, for example between 96 kHz and 192 kHz. The PWAM 125 includes a noise-shaping up-sampler and quantizer 410 at the input receiving the first digital feedback signal. The noise-shaping up-sampler and quantizer 410 raises the sampling frequency of the first digital feedback signal with a pre-set or programmable ratio—for example an integer ratio between 2 and 16 to generate a second digital feedback signal 415 at a second sampling frequency. The noise-shaping up-sampler and quantizer 410 is furthermore configured to quantize samples of the second digital feedback signal to a smaller number of bits than the samples of the first digital feedback signal. According to one exemplary embodiment of the quantizer 410 the samples of the first digital feedback signal has 24 bits per sample while the samples of the second digital feedback signal have been decimated to 11 bits. These samples may be generated according to a signed sample format where a sign bit takes one bit and a magnitude portion is represented by the residual 10 bits of the sample.

Figure 5:
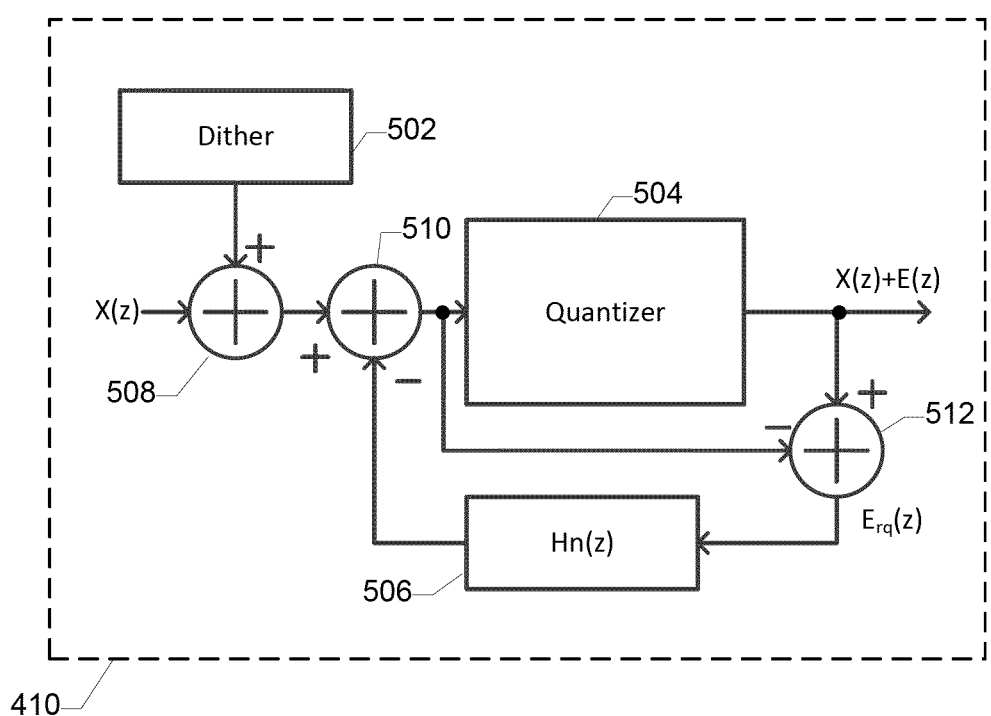
FIG. 5 is a simplified block diagram of an exemplary embodiment of a noise-shaping up-sampler and quantizer.

FIG. 5 shows a simplified block diagram of the noise-shaping up-sampler and quantizer 410 of the PWAM 125. The first digital feedback signal is represented by X(z) and the second digital feedback signal by X(z)+E(z), where E(z) represents a quantization noise component caused by the quantization operation carried out by the quantizer 504. The noise-shaping up-sampler and quantizer 410 includes a noise-shaping feedback loop extending through loop filter Hn(z) 506 to a second adder 510 on the input side, which adder shapes the spectrum of the generated quantization noise to higher frequencies and therefore maintains a relatively high resolution of the second digital feedback signal throughout the audio frequency range despite the quantization. The noise-shaping up-sampler and quantizer 410 may include a feedforward loop as illustrated extending to an output side summer 512. The noise-shaping up-sampler and quantizer 410 may also include the illustrated Dither generator 502, which adds a pseudo-random noise signal of appropriate level to the first digital feedback signal at the input of the noise-shaping up-sampler and quantizer 410 using a first input side adder 508. This pseudo-random noise signal may reduce audible artefacts associated with the quantization operation in a well-known manner.

Figure 6:
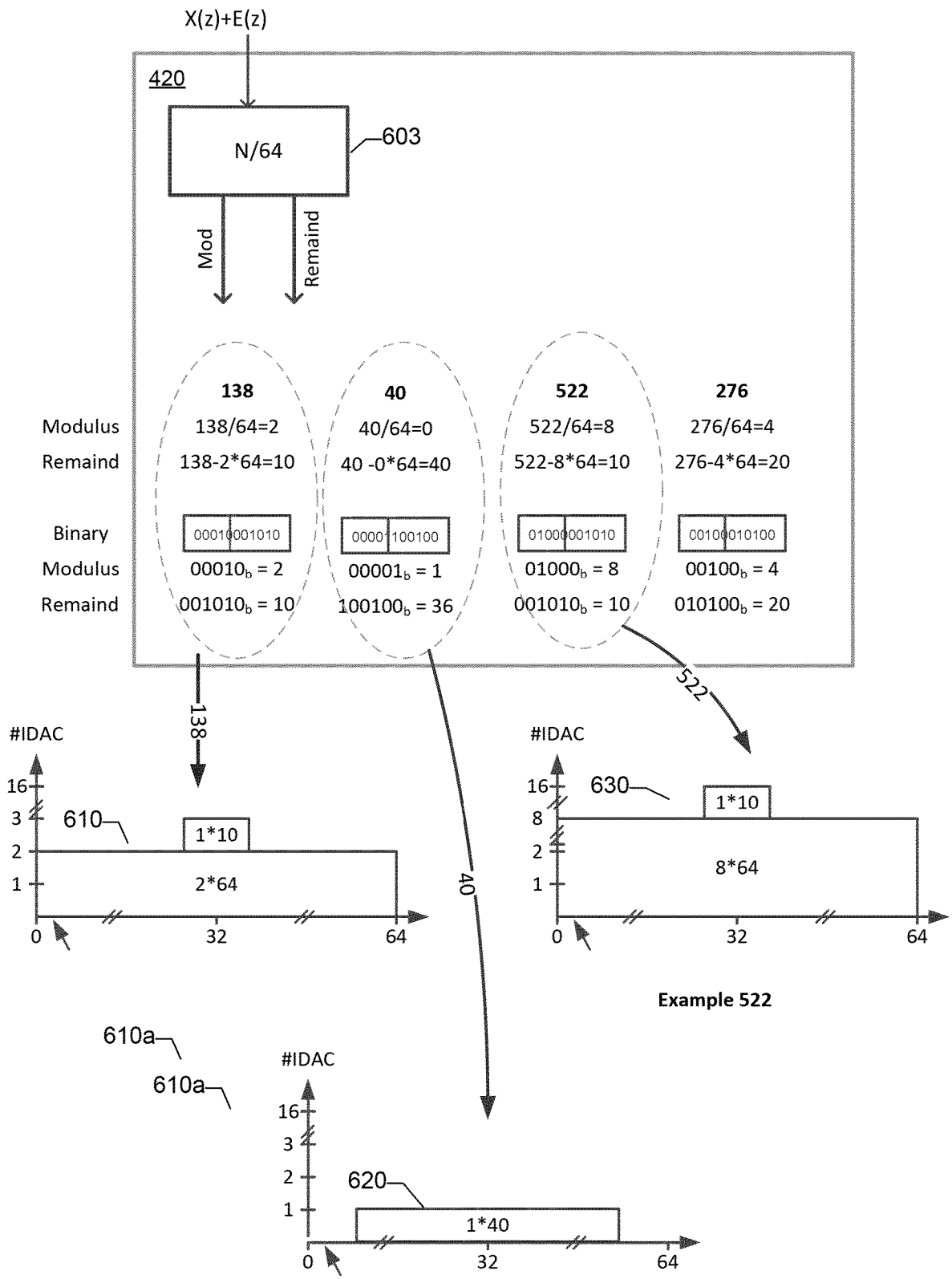
FIG. 6 is a schematic block diagram of the operation of a modulator portion of a hybrid Pulse-Width and Pulse-Amplitude Modulator (PWAM) according to various embodiments.

Referring further to FIG. 4, the PWAM 125 additionally includes a modulator 420 connected to the output of the noise-shaping up-sampler and quantizer 410 for receipt of the second digital feedback signal X(z)+E(z). The operation and functionality of an exemplary embodiment of the modulator 420 is schematically illustrated in FIG. 6. The modulator 420 takes the second feedback digital signal in the multibit (PCM) format and converts the second feedback digital signal into a pulse-width and pulse-amplitude modulated signal. The sampling frequency of this pulse-width and pulse-amplitude modulated signal may be markedly higher than the sampling frequency of the second digital feedback signal as discussed below. The sampling frequency of the pulse-width and pulse-amplitude modulated signal 425 may be at least 16 times higher than the sampling frequency of the second digital feedback signal, such as 32 or 64 times higher. One embodiment of the modulator 420 accepts a 192 kHz sampling frequency of the second digital feedback signal and generates a corresponding pulse-width and pulse-amplitude modulated signal at a sampling frequency of 12.288 MHz, and hence raises the sampling frequency of the latter by an upsampling factor of 64. The pulse-width and pulse-amplitude modulated signal 425 may be applied to a current output converter (IDAC) 130 (see, e.g., FIG. 4). The current output converter (IDAC) 130 is configured to convert or transform the pulse-width and pulse-amplitude modulated signal into a corresponding sequence of variable width and amplitude current pulses by controlling how individually controllable current generators (illustrated in FIGS. 7 and 8) are activated. The current output converter (IDAC) 130 may include an appropriately configured digital state machine. One embodiment of the current output converter (IDAC) 130 may include a dynamic element matching circuit 432 as schematically illustrated where the selection of individually controllable current generators of the current output converter is carried out in a randomized manner to average out offsets between nominally identical current generators.

Referring to FIG. 6, the second digital feedback signal X(z)+E(z) is applied to the input of the modulator 420 and the sampling frequency raised with a predetermined ratio, N, such as 64. In the present embodiment, the resolution of the second digital feedback signal is 11 bits as discussed previously. A dividing block or circuit 603 divides each 11 bits sample of the second digital feedback signal with N to compute respective modulus values and remainder values of the samples. The drawing shows four exemplary values, 138, 40, 522 and 276 using decimal notation, of the 11 bit samples of the second digital feedback signal expressed in decimal format initially. The decimal sample value 138 is divided by 64 producing a modulus value of 2 and a remainder value of 10 as illustrated. The corresponding computation is also illustrated for the three remaining samples 40, 522 and 276. The decimal sample value 138 is converted into binary format showing how the modulus value 2 corresponds to 00010b and the remainder value of 10 corresponds to 001010b. A first variable width and amplitude pulse 610 of the pulse-width and pulse-amplitude modulated signal is generated by conversion of the decimal sample value 138. The first variable width and amplitude pulse 610 is essentially constructed from two segments. A first pulse segment (2*64) has an amplitude of "2" (y-axis scale) spanning over a full pulse width, i.e. 100% modulation and pulse amplitude of 2—hence representing the modulus value "2." The first variable width and amplitude pulse 610 additionally includes a second pulse segment (1*10) spanning over merely 10 sample time clocks of the 12.288 MHz sampling frequency of the pulse-width and pulse-amplitude modulated signal. Stated in another way, the decimal sample value 138 is converted into an "analog" variable width and amplitude pulse with a corresponding pulse area.

The conversion of the decimal sample value 40 into the second variable width and amplitude pulse 620 is also illustrated. The decimal sample value 40 leads to a modulus value of 0 and a remainder value of 40 as illustrated. The corresponding, second, variable width and amplitude pulse 620 reflects this outcome by merely including a second pulse segment (1*40) with a "one" amplitude and spanning over merely 40 sample time clocks of the 12.288 MHz sampling frequency of the pulse-width and pulse-amplitude modulated signal. The conversion of the decimal sample value 522 into a third variable width and amplitude pulse 630 is finally illustrated using the same principles outlined above. The skilled person will understand that the modulator 420 is configured to convert incoming sample values into corresponding sequences of variable width and amplitude pulses where the pulse area of each of the variable width and amplitude pulses 610, 620, 630 represents the sample value in question. Hence, each of the variable width and amplitude pulses 610, 620, 630 can be viewed as an analog representation of the sample value in question.

The skilled person will understand that the modulator 420 may be configured to generate the variable width and amplitude pulses following different modulation schemes. In the present embodiment, each of the variable width and amplitude pulses is preferably centred at a midpoint of the pulse period, e.g., centered at the sample clock time 32 in this embodiment using an upsampling factor of 64. This centering is often referred to as a double-edge pulse-width modulation. However, other embodiments of the modulator 420 may be adapted to build the variable width and amplitude pulses by applying single-edge modulation.

Figure 7:
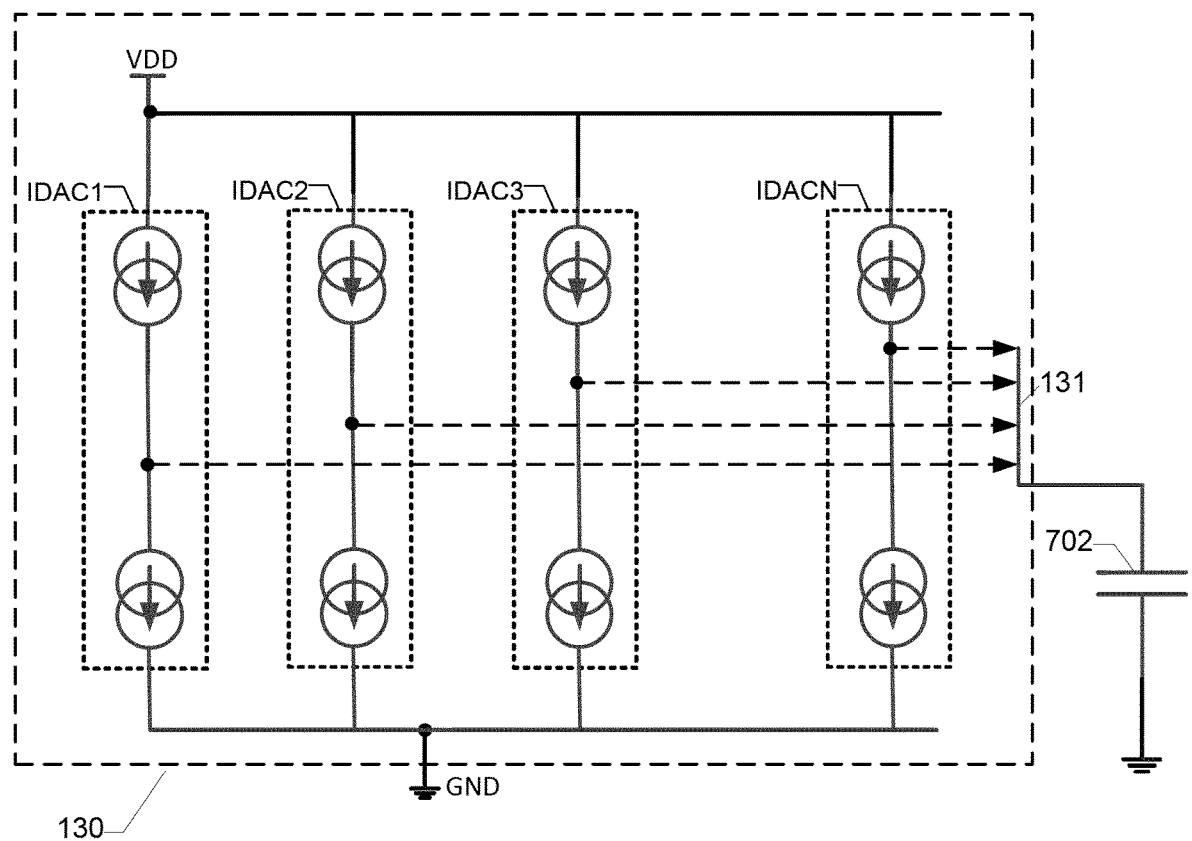
FIG. 7 is a simplified schematic block diagram of an exemplary embodiment of a current output converter forming part of a current mode DAC of the processing circuit.

FIG. 7 shows a simplified schematic block diagram of an exemplary embodiment of the current output converter 130 forming part of the current mode DAC of the processing circuit. The current output converter 130 includes a predetermined number, N, of individually controllable current generators IDAC1, IDAC2, IDAC3, IDACN, for example between 4 and 32 current generators, such as 16 current generators. The respective outputs of the N individually controllable current generators are connected in parallel to a common DAC output node 131. A capacitive transducer 702 is connected to the common DAC output node 131. The skilled person will understand that the capacitive transducer 702 may include the previously discussed capacitive transducer 102 of a miniature microphone assembly for sound reproduction. However, other types of capacitive transducer elements for sensing of various types of physical variables may in the alternative be driven by the present current mode DAC 702. The N individually controllable current generators IDAC1, IDAC2, IDAC3, IDACN may be nominally identical, but the skilled person will understand that component variations associated with semiconductor manufacturing may cause minor variations of characteristics between the controllable current generators, in particular current sinking and sourcing capabilities. Each of the N individually controllable current generators IDAC1, IDAC2, IDAC3, IDACN is configured to selectively source current into the capacitive transducer 702 or sink current from the capacitive transducer 702 in accordance with the switching control carried out by the current output converter (IDAC) 130, and thereby charge or discharge voltage across transducer 702. Each of the N individually controllable current generators IDAC1, IDAC2, IDAC3, IDACN can be considered a one-bit or 1.5 bit binary values+1 or −1. The sourcing and sinking of the predetermined current amount or level may be carried out by selecting between a first state and second state of the controllable current generator. Finally, each of the individually controllable current generators may include a third state or an idle/zero output state where the current generator neither sources nor sinks current to/from its output. In this idle state, the current generator may be placed in a high-impedance mode effectively disconnecting the current generator from the common DAC output 131 as discussed in further detail below. The skilled person will appreciate that the maximum positive output value of the current converter may correspond to setting all N individually controllable current generators IDAC1, IDAC2, IDAC3, IDACN to source current while the maximum negative output value corresponds to setting all N individually controllable current generators IDAC1, IDAC2, IDAC3, IDACN to sink current.

Figure 8:
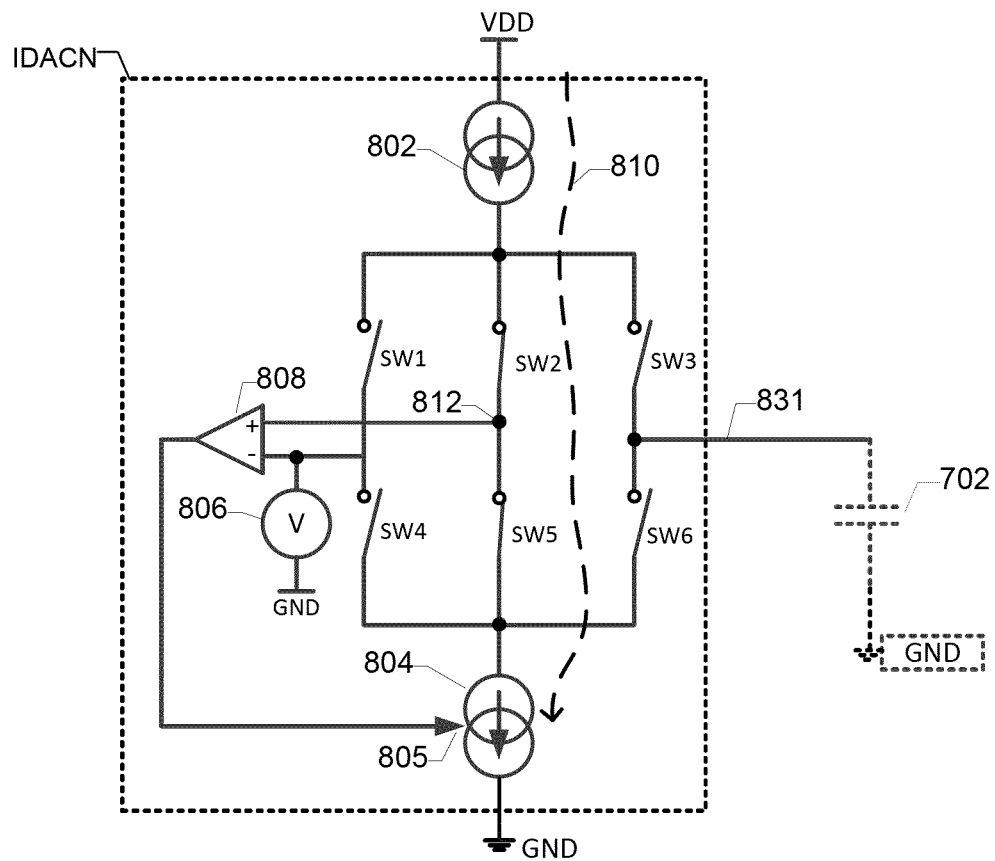
FIG. 8 is a simplified schematic block diagram of a controllable current generator and the exemplary current output converter operating in an idle state according to various embodiments.

FIG. 8 is a simplified schematic block diagram of the controllable current generator IDACN of the current output converter 130 when placed in the idle state or off-state discussed above. The controllable current generator IDACN includes a first current source 802 and a second current source 804 connected in series between the positive DC supply rail VDD and a negative DC supply rail which is ground (GND) in the present embodiment. A first switch pair, including switches SW2 and SW5, is coupled in-between the first and second current sources 802, 804 and is operating in a synchronized manner where both switches are simultaneously closed/conducting or open/non-conducting. The switches of the first switch pair SW2 and SW5 are closed in the idle state while the residual SW1, SW3, SW4 and SW6 are placed in open/non-conducting states as illustrated. This means that the current flowing through the first current source 802 and second current source 804 runs directly from VDD to GND as illustrated by the current path 810. Consequently, each of the first and second current sources 802, 804 is electrically disconnected from the output node 831 and the controllable current generator IDACN does therefore not source or sink any noticeable current to the capacitive transducer 702 when placed in the idle state.

The controllable current generator IDACN additionally includes a DC voltage reference 806 connected to an inverting input of a differential loop amplifier 808, e.g. an operational amplifier or other differential amplifier, of a feedback regulation loop of the IDACN. The voltage of the DC voltage reference 806 may be equal to one-half VDD. The differential loop amplifier 808 has a non-inverting input (+) connected to a midpoint node 812 arranged in-between the first switch pair SW2, SW5. An output of the differential loop amplifier 808 is connected to a control input 805 of the second current source 804 where the control input 805 is configured to adjust the current level of the second current source 804. The operation of the differential loop amplifier 808 therefore seeks to dynamically or adaptively adjust the voltage at the midpoint node 812 to approximately one-half VDD, which is the voltage set at the negative input of the differential loop amplifier 808, by adjusting the current flowing through second current source 804 via the control input 805. This adaptive adjustment of the voltage at the midpoint node 812 is carried out by a feedback regulation loop. Hence, the differential loop amplifier 808, the second current source 804 and the DC voltage reference 806 therefore jointly form a DC error suppression circuit which is configured to match or align the first and second current levels supplied by the first and second current sources 802, 804 during the idle state of the controllable current generator IDACN. In certain embodiments, the differential loop amplifier 808 may possess a relatively small bandwidth, or large time constant, compared to the sampling frequency of the incoming pulse-width and pulse-amplitude modulated signal. The upper cut-off frequency of the differential loop amplifier 808 may, for example, be smaller than 100 kHz, or smaller than 40 kHz, which effectively performs a slow averaging of the current source balancing to secure a long-term zero DC offset at the output of each of the controllable current generators.

This property has several noticeable advantages, for example leading to a linear I/O characteristic of the current output converter 130. The DC error suppression circuit also prevents build-up of DC voltage components on the load, which is a noticeable advantage in connection with driving capacitive transducer elements where DC off-sets or DC imbalances of the analog feedback signal will tend to drive the DC operating point of the capacitive transducer away from a target DC operating point. This potential build-up of DC off-set is caused by the charge integration carried out by the capacitance of the capacitive transducer element. The controllable current generator IDACN is operating in the previously discussed idle state where the output node 831 is in a high-impedance state supplying substantially zero current output. Each of the switches SW1, SW2, SW3, SW4, SW5 and SW6 may include a controllable semiconductor switch for example a MOSFET. Each of the switches SW1, SW2, SW3, SW4, SW5 and SW6 may include a control terminal, for example a gate terminal of a MOSFET, which switches the controllable semiconductor switch between its conducting and non-conducting states. These control terminals are connected to the previously discussed current output converter (IDAC) 130. The current level supplied by the first and second current sources 802, 804 may vary depending on requirements of a particular application such as a load impedance, e.g. the capacitance of the capacitive transducer 702 in the present embodiment, the sampling frequency of the pulse-width and pulse-amplitude modulated signal, the number of parallel connected controllable current generators of the current output converter 130, etc. In one exemplary embodiment of the current output converter 130 including 16 controllable current generators, the respective currents of the first and second current sources 802, 804 are set to about 100 pA, e.g. between 50 pA and 200 pA, when configured for driving a 1-4 pF capacitive transducer element. The current settings of the controllable current generators generally depend on a dv/dt at the peak amplitude of the analog feedback signal at the highest frequency of interest of the feedback loop. The currents of the controllable current generators should preferably be capable of charging the capacitance of the capacitive transducer 102 without slew-induced distortion under these conditions. The highest frequency of interest of the analog feedback signal may lie between 300 Hz and 3 kHz, for example about 1 kHz, in exemplary embodiments of the microphone assembly 100.

An output impedance at 10 kHz of each of the individually controllable current generators IDAC1, IDAC2, IDAC3, IDACN is in some embodiments preferably larger than 1 MΩ, such as larger than 10 MΩ or 100 MΩ, when operating in either the first state or the second state.

Figure 9A:
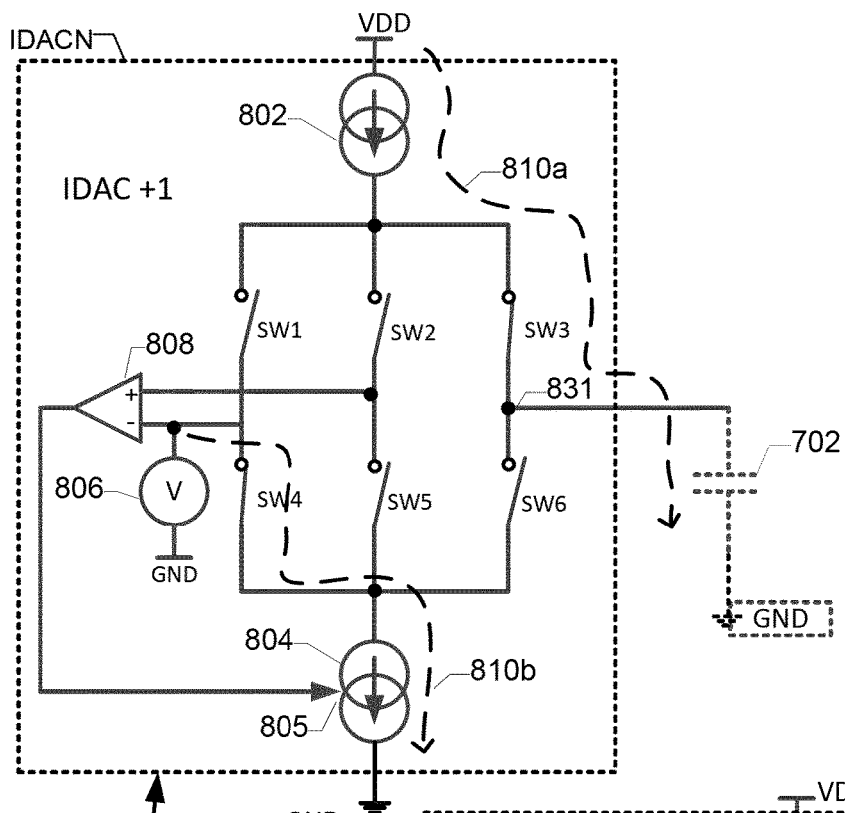
FIGS. 9A and 9B are simplified schematic block diagrams of a controllable current generator operating in first and second states, respectively, according to various embodiments.

FIG. 9A is a simplified schematic block diagram of the controllable current generator IDACN of the current output converter 130 when placed in the first state, or +1 state, discussed above where the output 831 is sourcing the predetermined current level to the capacitive transducer 702 or other load circuit. In the first state, the switches of the first switch pair SW2 and SW5 are open or non-conducting and the switches SW1 and SW6 are both open or non-conducting as illustrated. The residual switches SW4 and SW3 are in contrast placed in conducting or closed states as illustrated. This combination of switch states means that the current flowing through the first current source 802 is sourced into the capacitive transducer 702 via current path 810a while the current generated by the second current source 804 runs from the DC voltage reference 806, which may be equal to one-half VDD, directly to GND via the current path 810b. Consequently, the controllable current generator IDACN sources the predetermined current level to the capacitive transducer 702 when placed in the first state. The skilled person will understand that the DC balancing of the current levels of the first current source 802 and the second current source 804 is still maintained by the operation of the previously discussed DC error suppression circuit.

Figure 9B:
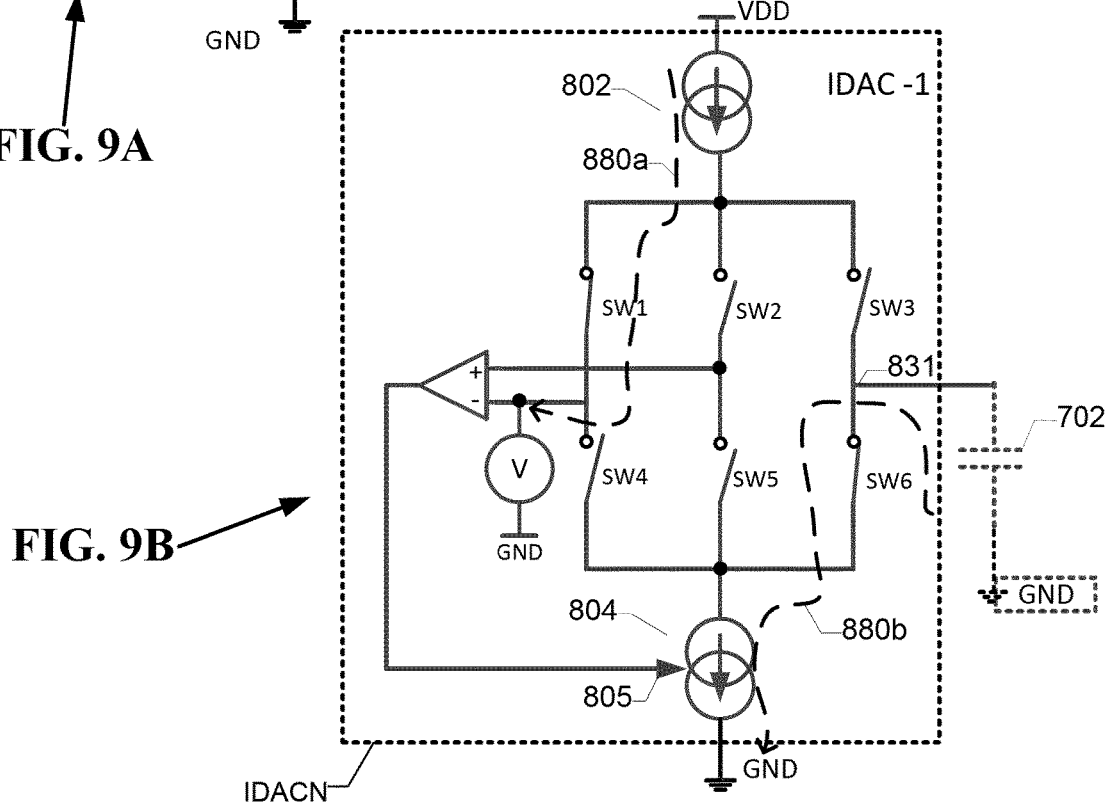

FIG. 9B is a simplified schematic block diagram of the controllable current generator IDACN of the current output converter 130 when placed in the second state, or −1 state, discussed above where the output 831 is sinking the predetermined current level from the capacitive transducer 702 or other load circuit to discharge the load circuit. In the second state, the switches of the first switch pair SW2 and SW5 are open or non-conducting and the switches SW4 and SW3 are both open or non-conducting as illustrated. The residual switches SW1 and SW6 are in contrast placed in conducting or closed states as illustrated. This combination of switch states means that the current flowing through the first current source 802 is sourced into the DC voltage reference 806 and thereafter to GND via the current path 880a. In contrast, the predetermined current generated by the second current source 804 is drawn out of the capacitive transducer 702 via current path 880b to discharge the capacitive transducer 702. Consequently, the controllable current generator IDACN sinks the predetermined current level from the capacitive transducer 702 when placed in the second state. The skilled person will understand that the DC balancing of the current levels of the first current source 802 and the second current source 804 is still maintained by the operation of the previously discussed DC error suppression circuit.

The skilled person will understand that above outlined switch arrangement and associated switching scheme of the switches SW1, SW2, SW3, SW4, SW5 and SW6 through the first, second and third states of each of the controllable current generators allow the first and second current sources to operate in an unswitched manner even during time periods where they do not source or sink current to the load circuit. Instead, the superfluous current of a particular current generator is directed through the DC voltage reference 806 by selecting an appropriate setting of the switches. This feature eliminates switching noise for example caused by charge injection from repetitious switching of the first and second current sources when cycling through the first, second and third states.

Figure 10:
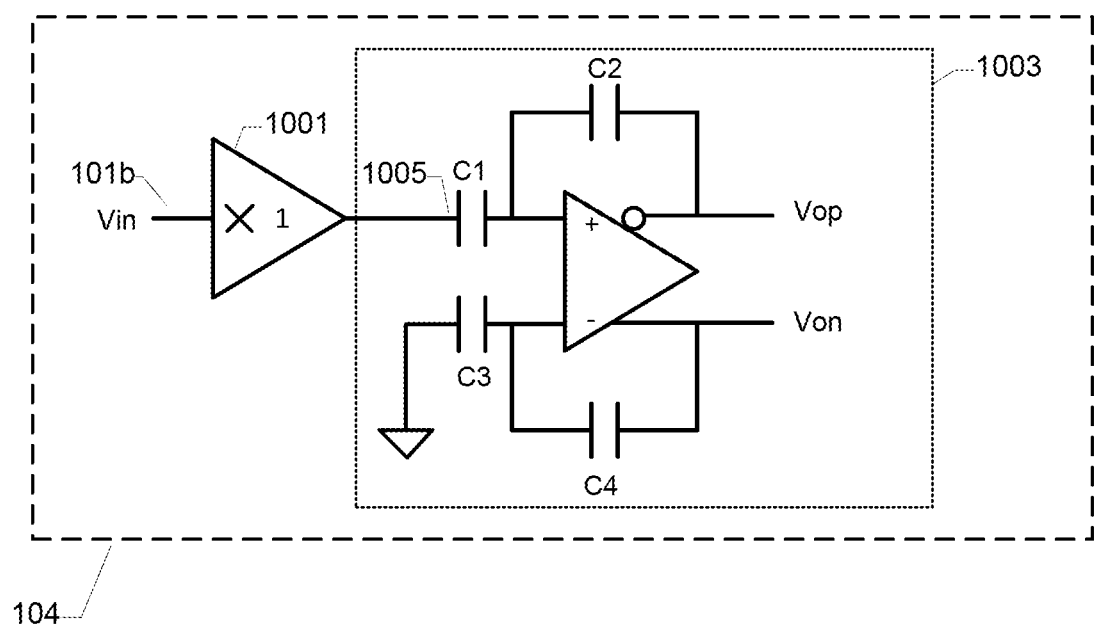
FIG. 10 is a simplified schematic block diagram of an exemplary microphone preamplifier of a processing circuit.

FIG. 10 is a simplified schematic block diagram of an exemplary AC-coupled microphone preamplifier 104 suitable for use in the processing circuit to interface to the transducer at the input side and to a differential input of the previously discussed analog-to-digital converter 108 at the output side. The skilled person will understand that other embodiments of the processing circuit may include a DC-coupled preamplifier to achieve the previously discussed advantages.

The microphone preamplifier 104 includes a unity gain buffer stage 1001 coupled in series with an AC-coupled gain stage 1003. The input voltage Vin to the unity gain buffer stage 1001 includes the microphone signal supplied via the previously discussed (See, e.g., FIG. 2) input node 101b connected to the transducer output 101a of the transducer 102. The unity gain buffer stage 1001 is single-ended in the present embodiment and delivers a buffered microphone signal or voltage to the input 1005 of the AC-coupled gain stage 1003. The small signal gain of the AC-coupled gain stage 1003 to a positive output at Vop is determined by a capacitance ratio between capacitors C1 and C2 and may lie between 12 and 30 dB. The small signal gain of the AC-coupled gain stage 1003 to a negative output at Von is determined by a capacitance ratio between capacitors C4 and C3. The latter small signal is preferably set equal to the small signal gain to the positive output at Vop of the AC-coupled gain stage 1003. Consequently, the microphone preamplifier 104 generates an amplified microphone signal in differential or balanced format across the positive and negative outputs Vop, Von based on the single-ended microphone signal at the input 101b. The unity gain buffer stage 1001 may exhibit an extremely high input impedance to avoid loading the transducer output in view of the potentially very high output impedance of the transducer as discussed above. If the transducer includes the previously discussed capacitive transducer 102 the input impedance of the unity gain buffer stage 1001 may be larger than 100 MΩ, such as larger than 1 GΩ. The differential or balanced microphone voltage at the positive and negative outputs Vop, Von is applied to a differential input of the analog-to-digital converter for conversion into the single-bit or multibit digital microphone signal as discussed above.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A microphone assembly comprising:
   a capacitive transducer producing an electrical signal at a transducer output;
   a signal conditioning circuit comprising an input node connected to the transducer output, the signal conditioning circuit producing an amplified or buffered electrical signal at an output of the signal conditioning circuit;
   an analog-to-digital converter (ADC) coupled to the output of the signal conditioning circuit and producing a digital signal; and
   a digital feedback loop having an input coupled to the ADC and an output coupled to the capacitive transducer, the digital feedback loop producing a sequence of variable current pulses based on the digital signal, the variable current pulses adding charge to, or subtracting charge from, the capacitive transducer such that low frequencies of the electrical signal are suppressed before the electrical signal is input to the signal conditioning circuit.

2. The microphone assembly of claim 1, wherein the digital feedback loop further comprises a pulse-width and pulse-amplitude modulator coupled to the ADC that coverts the digital signal into a pulse-width and pulse-amplitude modulated signal.

3. The microphone assembly of claim 2, wherein the sampling frequency of the pulse-width and pulse-amplitude modulated signal is higher than the sampling frequency of the digital signal.

4. The microphone assembly of claim 1, further comprising a housing having a port, wherein the capacitive transducer is a microelectromechanical systems (MEMS) transducer, and wherein the capacitive transducer is disposed in the housing.

5. The microphone assembly of claim 1, wherein the digital feedback loop further comprises a digital loop filter coupled to the ADC, and wherein the low frequency suppressed electrical signal at least partially reduces low frequency overload and distortion of the signal conditioning circuit.

6. The microphone assembly of claim 5, wherein the ADC comprises:
 a sigma-delta modulator configured to generate an N-Bit digital signal at a first sampling frequency, wherein N>0;
 a decimator between the sigma-delta modulator and the digital loop filter, the decimator configured to convert the N-Bit digital signal into an M-Bit digital signal at a second sampling frequency, wherein the second sampling frequency is lower than the first sampling frequency and wherein M>1; and
 wherein the M-bit digital signal is input to the digital loop filter.

7. The microphone assembly of claim 5, wherein the digital loop filter is a low pass filter comprising a fixed or configurable transfer function.

8. The microphone assembly of claim 5, wherein the digital feedback loop further comprises a noise-shaping quantizer disposed between the digital loop filter and the capacitive transducer.

9. The microphone assembly of claim 1, wherein the input node of the signal conditioning circuit is DC-coupled to the transducer output.

10. The microphone assembly of claim 1, further comprising a housing comprising a sound port, the housing enclosing the capacitive transducer, the signal conditioning circuit, the ADC, the digital feedback loop.

11. The microphone assembly of claim 10 in combination with a portable communication device.

12. A semiconductor die comprising:
 a conditioning circuit comprising an input node connectable to a capacitive microelectromechanical systems (MEMS) transducer, the conditioning circuit producing an amplified or buffered electrical signal at an output of the conditioning circuit;
 an analog-to-digital converter (ADC) coupled to the output of the conditioning circuit and producing a digital signal; and
 a digital feedback loop having an input coupled to the ADC and an output connectable to the capacitive MEMS transducer, the digital feedback loop producing a sequence of variable current pulses based on the digital signal, the variable current pulses adding charge to, or subtracting charge from, the capacitive MEMS transducer such that low frequencies of an electrical signal are suppressed before the electrical signal is input to the conditioning circuit.

13. The semiconductor die of claim 12, wherein the digital feedback loop further comprises a pulse-width and pulse-amplitude modulator coupled to the ADC that coverts the digital signal into a pulse-width and pulse-amplitude modulated signal.

14. The semiconductor die of claim 13, wherein the sampling frequency of the pulse-width and pulse-amplitude modulated signal is higher than the sampling frequency of the digital signal.

15. The semiconductor die of claim 12, wherein the digital feedback loop further comprises a digital loop filter coupled to the ADC, and a noise-shaping quantizer disposed between the digital loop filter and the capacitive MEMS transducer, wherein the low frequency suppressed electrical signal at least partially reduces low frequency overload and distortion of the conditioning circuit.

16. A microphone assembly comprising:
 a capacitive microelectromechanical systems (MEMS) transducer, the capacitive MEMS transducer producing an electrical signal in response to detecting a change in air pressure, the electrical signal including frequencies in a first frequency range and frequencies in a second frequency range, the first frequency range higher than DC and the second frequency range higher than the first frequency range;
 a processing circuit coupled to the capacitive MEMS transducer, the processing circuit producing an output audio signal based on the electrical signal generated by the capacitive MEMS transducer, the processing circuit comprising an analog-to-digital converter (ADC) producing a digital signal; and
 a compensation circuit coupled to the processing circuit and the capacitive MEMS transducer, the compensation circuit configured to suppress frequencies in the first frequency range before the electrical signal is input to the processing circuit.

17. The microphone assembly of claim 16, wherein the first frequency range includes frequencies below a human audible range of frequencies and the second frequency range includes frequencies within the human audible range, and wherein the compensation circuit is configured to cancel frequencies below the human audible range from the electrical signal before the electrical signal is applied to the processing circuit.

18. The microphone assembly of claim 17, further comprising a housing, the capacitive MEMS transducer, the processing circuit, and the compensation circuit disposed in the housing and an output of the processing circuit coupled to an electrical interface contact of the microphone assembly.

19. The microphone assembly of claim 16, wherein the compensation circuit comprises a pulse-width and pulse-amplitude modulator that converts the digital signal into a pulse-width and pulse-amplitude modulated signal at a higher frequency than the digital signal.

20. The microphone assembly of claim 19, the compensation circuit further comprising:
 a low pass digital loop filter disposed between the processing circuit and the pulse-width and pulse-amplitude modulator; and
 a noise-shaping quantizer disposed between the low pass digital loop filter and the pulse-width and pulse-amplitude modulator; and
 wherein the electrical signal at least partially reduces low frequency overload and distortion of the processing circuit.

* * * * *